United States Patent
Huang et al.

(10) Patent No.: US 7,648,783 B2
(45) Date of Patent: Jan. 19, 2010

(54) CADMIUM TIN OXIDE MULTI-LAYER LAMINATE AND PRODUCING METHOD THEREOF

(75) Inventors: Tien-Heng Huang, Yongkang (TW);
Ren-Jye Wu, Hsinchu (TW);
Wen-Hsuan Chao, Houlong Township, Miaoli County (TW); Lih-Ping Wang, Shalu Township, Taichung County (TW);
Hung-Chiao Cheng, Hsinchu (TW);
Jassy Shian-Jy Wang, Jhudong Township, Hsinchu County (TW);
Shu-Hei Wang, Jhubei (TW); John R. Rodgers, Ottawa (CA)

(73) Assignees: Industrial Research Technology Institute, Hsinchu (TW); Toth Information System, Inc., Ottawa, ON (CA)

( * ) Notice: Subject to any disclaimer, the term of this patent is extended or adjusted under 35 U.S.C. 154(b) by 589 days.

(21) Appl. No.: 11/311,317

(22) Filed: Dec. 20, 2005

(65) Prior Publication Data
US 2006/0141266 A1 Jun. 29, 2006

(30) Foreign Application Priority Data
Dec. 23, 2004 (TW) .............................. 93140292 A

(51) Int. Cl.
*B32B 15/04* (2006.01)
*C23C 14/00* (2006.01)
*C23C 14/08* (2006.01)
(52) U.S. Cl. .................. 428/702; 427/419.2; 204/192.1

(58) Field of Classification Search ................. 428/701, 428/702
See application file for complete search history.

(56) References Cited

U.S. PATENT DOCUMENTS

| 3,811,953 | A | * | 5/1974 | Nozik | 136/256 |
| 4,348,453 | A | * | 9/1982 | Cohen | 428/333 |
| 5,180,476 | A | * | 1/1993 | Ishibashi et al. | 204/192.29 |
| 5,922,142 | A | * | 7/1999 | Wu et al. | 136/260 |
| 6,137,048 | A | * | 10/2000 | Wu et al. | 136/260 |
| 6,221,495 | B1 | * | 4/2001 | Wu et al. | 428/432 |

FOREIGN PATENT DOCUMENTS

| DE | 2654094 | A | * | 6/1977 |
| EP | 447850 | A2 | * | 9/1991 |
| FR | 2579197 | A | * | 9/1986 |
| GB | 2013724 | A | * | 8/1979 |
| WO | WO 9847702 | A1 | * | 10/1998 |

OTHER PUBLICATIONS

English translation for FR2579197 A to Cohen S, Sep. 1986.*

* cited by examiner

*Primary Examiner*—John J. Zimmerman
*Assistant Examiner*—Aaron Austin
(74) *Attorney, Agent, or Firm*—Bacon & Thomas, PLLC

(57) ABSTRACT

A cadmium tin oxide ($Cd_{1-x}Sn_xO$) multi-layer laminate is disclosed. The laminate comprises: a substrate; and a layer of $Cd_{1-x}Sn_xO$ which is not an epitaxial structure; wherein, the composition of Sn/(Cd+Sn) is 1~20%. The method for producing the $Cd_{1-x}Sn_xO$ multi-layer laminate is also described here. The method comprises steps of: (a) providing metal or oxide targets for sputtering films of $Cd_{1-x}Sn_xO$; and (b) sputtering films of $Cd_{1-x}Sn_xO$ from the targets onto the substrate; wherein the composition of Sn/(Cd+Sn) is 1~20%.

13 Claims, 2 Drawing Sheets

CADMIUM TIN OXIDE MULTI-LAYER LAMINATE AND PRODUCING METHOD THEREOF

BACKGROUND OF THE INVENTION

1. Field of the Invention

The present invention relates to transparent-oxide-film compositions with high conductivity and, more particularly, to transparent conductive cadmium tin oxide films with properties of high transmittance and low specific electrical resistance.

2. Description of Related Art

Science and technology continues to progress rapidly and increasingly permeates the real, daily lives of people rather than general unseen improvements. In terms of electronic devices, consumers nowadays not only search for products with smaller sizes, but also demand humanized and easy-to-use features within them. Integration of those communication products such as Personal Digital Assistants (PDA), Liquid Crystal Displays (LCD) and 3C products in recent years is designed to cater to such demand.

Manufacturing the above-mentioned products requires a large amount of transparent electrode, among which the most commonly used material is indium tin oxide ($In_2O_3$:Sn). Also known as ITO, it is the product obtained after mixing indium oxide with a small amount of tin. However, the demand for a better conductivity and transmittance from the transparent conductive film increases as the high definition and high response speed of flat panel displays, such as OLED, develop over time. Besides, while the manufacturing rates of flat panel displays, LED lights and various kinds of applications involving indium increase nowadays, the demand for this rare metal is expected to go nowhere but upward. It is only a matter of time before indium will be consumed to its depletion. Hence, a solution must be provided as soon as possible as a precaution. Based on the two factors as mentioned above, it is essential to develop a non-indium transparent conductive film with better conductivity while possessing great transmittance property at the same time.

In a cation having a configuration of $(n-1)d^{10}ns^0 (n\geq 4)$, $In^{+3}$ or $Cd^{+2}$ has a broad orbital. Given a proper introduction of carriers, high-quality conductivity can be carried out. Therefore, it is applicable to dope a proper amount of tin into cadmium oxide to substitute for indium tin oxide (ITO). The purpose of doping tin into cadmium oxide is to replace cadmium in the oxide structure, forming an n-type TCO material. Due to very high transmittance in the visible light band (light wavelength between 400 nm and 700 nm) and great conductivity, the transparent conductive film of cadmium tin oxide ($CdO-SnO_2$) possesses both low resistivity and high transmittance properties at the same time.

SUMMARY OF THE INVENTION

The present invention develops cadmium tin oxide (CdO:Sn) material by high-throughput screening through combinatory chemistry of a chemical chip, in which both the cadmium oxide and the tin are utilized as sputtering targets; the position of the sputtering targets and the moving rate are monitored by the computer. Since the sputtering rate on each point of the material chip is affected by the distance to the sputtering target, the concentration of tin on the CdO:Sn material chip can, therefore, be controlled by adjusting the position of the tin sputtering target. A material chip with a distribution of different specific resistance will be obtained as a result.

A cadmium tin oxide ($Cd_{1-x}Sn_xO$) multi-layer laminate comprises: a substrate and a cadmium tin oxide layer, wherein the cadmium tin oxide layer is a non-epitaxial structure, and the atomic ratio of tin to cadmium and tin of said cadmium tin oxide layer [Sn/(Cd+Sn)] is 1~20%.

The present invention further includes a method for preparing the cadmium tin oxide multi-layer laminate that comprises the following steps: (a) providing a substrate; and (b) co-sputtering both cadmium oxide and tin targets to form a non-epitaxial cadmium tin oxide ($Cd_{1-x}Sn_xO$) layer, in which the atomic ratio of tin to cadmium and tin of the cadmium tin oxide layer [Sn/(Cd+Sn)] is 1~20%.

To achieve the objective of replacing ITO, the cadmium tin oxide multi-layer laminate of the present invention provides the specific resistance of $10^{-5}$ Ω-cm, which is less than that of ITO at $10^{-4}$ Ω-cm. Meanwhile, the transmittance of the multi-layer laminate of the present invention is greater than 85%, preferably 90%. Further, the amount of tin in the total composition of cadmium tin oxide is an important factor that affects both the level of conductivity and transmittance; therefore, the preferred atomic ratio of the quantity of tin to cadmium and tin [Sn/(Cd+Sn)] is 1~20%, more preferably 1~10% and 1~4% as optimum.

In the method of the present invention, the sputtering in step (b) can be operated under the conditions that have frequently been practiced; however, in order to allow the finished cadmium tin oxide multi-layer laminate to achieve the desired properties, including high conductivity and high transmittance, a higher sputtering temperature can be employed to obtain the above properties as expected. The method of the present invention can also be prepared under a lower temperature at 220° C., or can be under room temperature, which is roughly 20 to 30° C.

DETAILED DESCRIPTION OF THE PREFERRED EMBODIMENT

Figure 1:
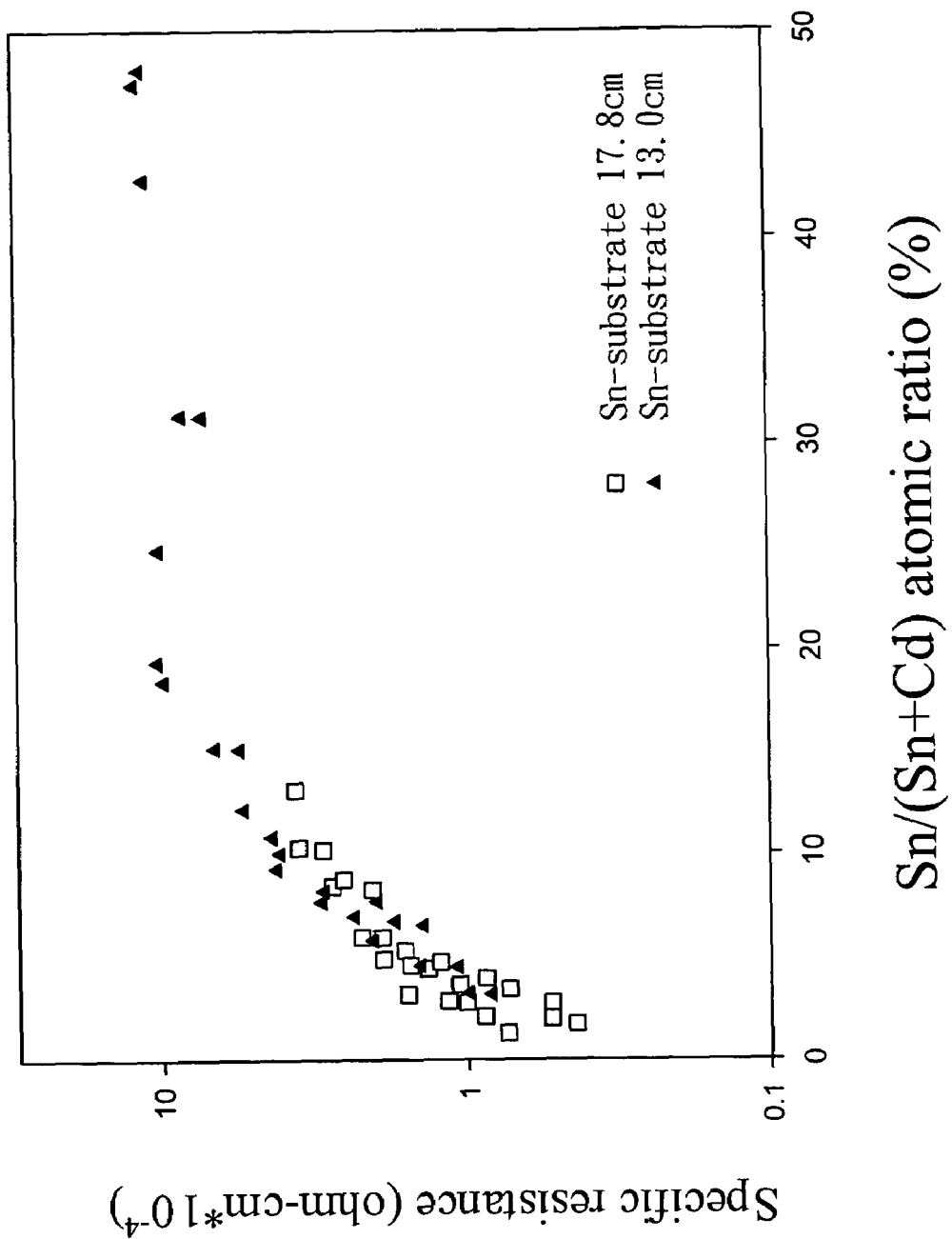
FIG. 1 is a diagram showing the relation between the composition of cadmium tin oxide and the corresponding specific resistance.

The specific resistance of ITO is approximately $10^{-4}$ Ω-cm, and its transmittance is 85%; cadmium tin oxide that is intended to replace ITO, therefore, should have its specific resistance under $10^{-4}$ Ω-cm, whereas the transmittance should be greater than 85%.

By utilizing the conventional sputtering techniques and having it combined with the concept of high throughput screening in combinatory chemistry, the composition of cadmium oxide: tin is intensively selected as described in the following embodiment.

Example 1

Preparation of $Cd_{1-x}Sn_xO$ Chip

A $Cd_{1-x}Sn_xO$ chip is made by co-sputtering both the cadmium oxide target and the tin target on a 7 cm×7 cm glass substrate. A square mask is placed on the substrate for the purposes of positioning and measurement. The side of the mask is 7 cm long, in which the square is further divided into twenty-five smaller squares with 1 cm on each side and 0.5 cm in between each square. The angle between both the cadmium oxide target and the tin target is 45 degrees, and the cadmium oxide target and the tin target are roughly 9.4 cm and 13 cm away from the glass substrate respectively. At room temperature the power of the cadmium oxide target and the tin target are 150 W and 50 W respectively, and the sputtering shall last for 5 minutes.

The composition distribution of Sn/(Cd+Sn) of the synthesized $Cd_{1-x}Sn_xO$ chip based on the above conditions is listed in Table 1, and the distribution of its specific resistance is listed in Table 2.

TABLE 1

Distribution chart of the composition of $Cd_{1-x}Sn_xO$ chip [Sn/(Cd + Sn)%]

| | | | | |
|---|---|---|---|---|
| 10.41 | 8.72  | 4.53  | 2.72  | 2.65  |
| 10.10 | 7.22  | 7.83  | 4.98  | 3.98  |
| 14.43 | 12.28 | 6.94  | 6.38  | 6.82  |
| 23.12 | 20.57 | 16.29 | 12.29 | 9.26  |
| 37.09 | 35.23 | 34.03 | 27.16 | 22.52 |

Sn/(Cd + Sn)%

TABLE 2

Distribution chart of the specific resistance of $Cd_{1-x}Sn_xO$ chip ($\Omega$ cm × $10^4$)

| | | | | |
|---|---|---|---|---|
| 4.1  | 3.03 | 2.02 | 1.46 | 1.51 |
| 5.56 | 4.29 | 2.92 | 2.1  | 1.73 |
| 7.61 | 6.1  | 4.42 | 3.13 | 2.1  |
| 8.62 | 7.67 | 6.59 | 4.87 | 3.25 |
| 9.01 | 7.05 | 6.73 | 7.17 | 5.19 |

($\Omega$ cm × $10^4$)

Example 2

Preparation of $Cd_{1-x}Sn_xO$ Chip

A $Cd_{1-x}Sn_xO$ chip is made by co-sputtering both the cadmium oxide target and the tin target on a 7 cm×7 cm glass substrate. A square mask is placed on the substrate for positioning in terms of measurement. The side of the mask is 7 cm long, in which the square is further divided into twenty-five smaller squares with sides each 1 cm in length and 0.5 cm in between each square. The angle between both the cadmium oxide target and the tin target is 45 degrees, and the cadmium oxide target and the tin target are approximately 9.4 cm and 13 cm away from the glass substrate respectively. The sputtering shall last for 5 minutes at 220° C.; the power of the cadmium oxide target and the tin target are 150 W and 50 W respectively.

The composition distribution of Sn/(Cd+Sn) of the synthesized $Cd_{1-x}Sn_xO$ chip based on above conditions is listed in Table 3, and the distribution of its specific resistance is listed in Table 4.

TABLE 3

Distribution chart of the composition of $Cd_{1-x}Sn_xO$ chip [Sn/(Cd + Sn)%]

| | | | | |
|---|---|---|---|---|
| 2.76  | 3.42  | 1.74  | 2.06 | 1.29 |
| 5.29  | 2.84  | 3.95  | 1.99 | 2.75 |
| 4.88  | 3.15  | 4.41  | 3.65 | 2.1  |
| 8.43  | 5.95  | 5.94  | 4.58 | 4.75 |
| 13.12 | 10.28 | 10.18 | 8.73 | 8.25 |

Sn/(Cd + Sn)%

TABLE 4

Distribution chart of the specific resistance of $Cd_{1-x}Sn_xO$ chip ($\Omega$ cm × $10^4$)

| | | | | |
|---|---|---|---|---|
| 1.01 | 0.73 | 0.44 | 0.53 | 0.74 |
| 1.61 | 1.16 | 0.87 | 0.53 | 0.53 |
| 1.9  | 1.58 | 1.35 | 1.06 | 0.88 |
| 2.77 | 2.22 | 1.91 | 1.55 | 1.23 |
| 3.66 | 3.57 | 2.98 | 2.55 | 2.05 |

($\Omega$ cm × $10^4$)

Example 3

Preparation of $Cd_{1-x}Sn_xO$ Chip

Figure 2:
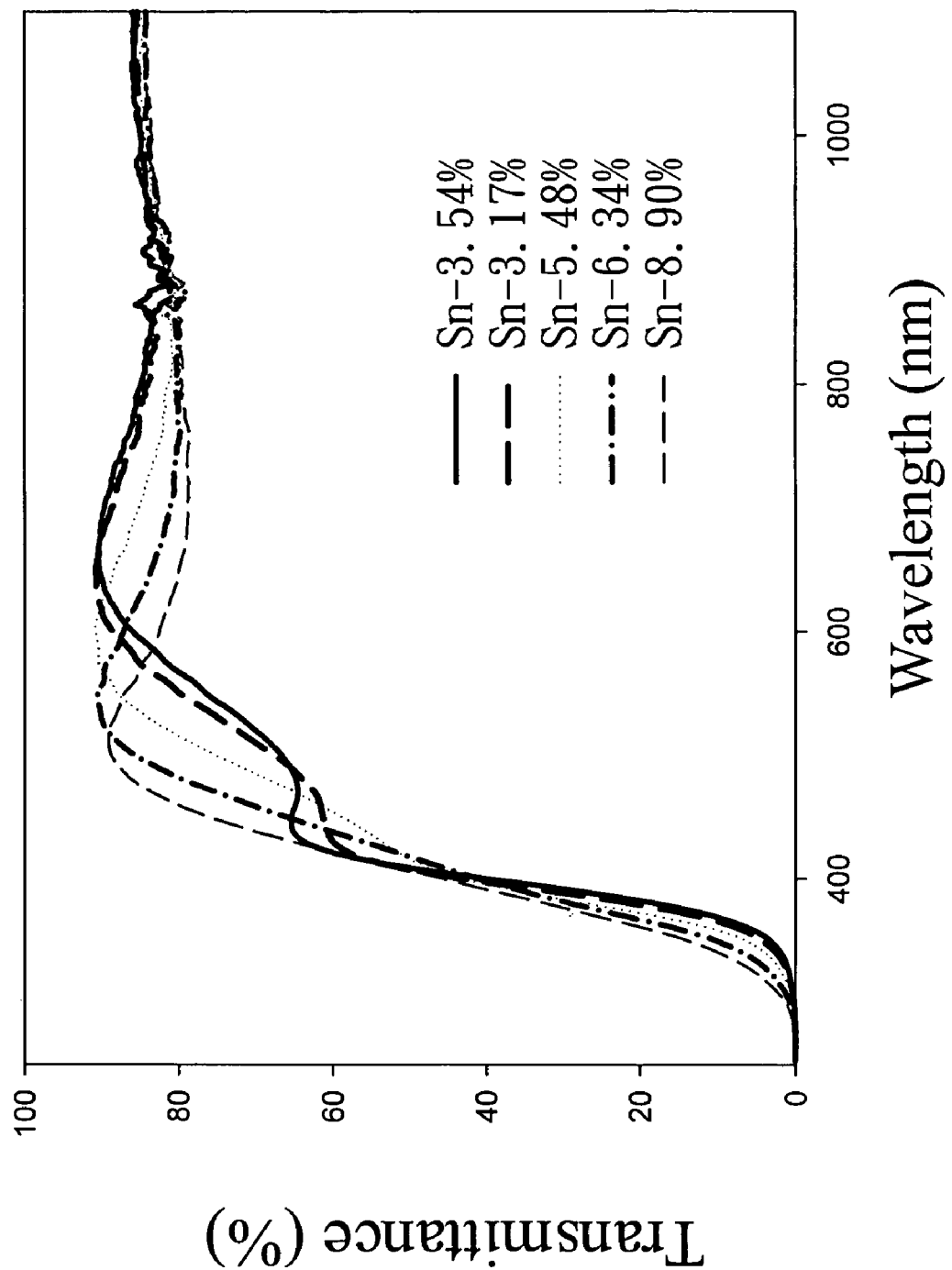
FIG. 2 is a diagram showing the relation between the composition of cadmium tin oxide and the corresponding transmittance.

Most of the conditions for preparation in this example are identical to those in Example 2, except the distances from the cadmium oxide target and the tin target to the glass substrate, which are adjusted to 17.8 cm and 13 cm respectively. From FIG. 1 it is known that when the atomic ratio of tin in cadmium tin oxide is controlled at 1~20%, the specific resistance is less than $10^{-3}$ $\Omega$-cm, and the transmittance is greater than 85%. When the atomic ratio of tin in cadmium tin oxide is controlled at 1~4%, the specific resistance is less than $10^{-4}$ $\Omega$-cm, and the transmittance can reach as high as 90%, after being annealed at a proper level; please refer to FIG. 2.

Although the present invention has been explained in relation to its preferred embodiment, it is to be understood that many other possible modifications and variations can be made without departing from the scope of the invention as hereinafter claimed.

What is claimed is:

1. A cadmium tin oxide, $Cd_{1-x}Sn_xO$, multi-layer laminate comprises:
   a substrate; and
   a non-epitaxial cadmium tin oxide layer;
   wherein the atomic ratio of tin to cadmium and tin of said cadmium tin oxide layer [Sn/(Cd+Sn)=x/(1−x)+(x)=x] is 1~20%, the specific resistance of said multi-layer laminate is less than $10^{-3}$ $\Omega$-cm, the transmittance of said multi-layer laminate is greater than 85%, and the multi-layer laminate is a transparent electrode.

2. The multi-layer laminate in claim 1, wherein the atomic ratio of tin to cadmium and tin of said cadmium tin oxide layer is 1~10%.

3. The multi-layer laminate in claim 1, wherein the atomic ratio of tin to cadmium and tin of said cadmium tin oxide layer is 1~4%.

4. The multi-layer laminate in claim 3, wherein the specific resistance of said multi-layer laminate is less than $10^{-4}$ $\Omega$-cm.

5. The multi-layer laminate in claim 3, wherein the transmittance of said multi-layer laminate is greater than 90%.

6. A method for preparing a multi-layer laminate having a non-epitaxial cadmium tin oxide layer, comprising:
   (a) providing a substrate; and
   (b) co-sputtering both cadmium oxide and tin targets to form a non-epitaxial cadmium tin oxide ($Cd_{1-x}Sn_xO$) layer;
wherein the atomic ratio of tin to cadmium and tin of said cadmium tin oxide layer [Sn/(Cd+Sn)=x/(1−x)+(x)=x] is 1~20%, the specific resistance of said multi-layer laminate is less than $10^{-3}$ $\Omega$-cm, the transmittance of said multi-layer laminate is greater than 85%, and the multi-layer laminate is a transparent electrode.

7. The method in claim 6, wherein the target in the step (b) is made of cadmium, tin, cadmium and tin alloy, tin oxide, cadmium oxide, cadmium tin oxide or combinations thereof.

8. The method in claim 6, wherein the atomic ratio of tin to cadmium and tin of said cadmium tin oxide layer is from 1 to 10%.

9. The method in claim 6, wherein the co-sputtering in the step (b) is processed at a temperature lower than 250° C.

10. The method in claim 6, wherein the co-sputtering in the step (b) is processed at a room temperature.

11. The method in claim 6, wherein the atomic ratio of tin to cadmium and tin of said multi-layer laminate having the non-epitaxial cadmium tin oxide layer is 1~4%.

12. The method in claim 11, wherein the specific resistance of said multi-layer laminate having the non-epitaxial cadmium tin oxide layer is less than $10^{-4}$ Ω-cm.

13. The method in claim 11, wherein the transmittance of said multi-layer laminate having the non-epitaxial cadmium tin oxide layer is greater than 90%.

* * * * *

UNITED STATES PATENT AND TRADEMARK OFFICE
CERTIFICATE OF CORRECTION

| | | |
|---|---|---|
| PATENT NO. | : 7,648,783 B2 | Page 1 of 1 |
| APPLICATION NO. | : 11/311317 | |
| DATED | : January 19, 2010 | |
| INVENTOR(S) | : Huang et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 787 days.

Signed and Sealed this

Twenty-eighth Day of December, 2010

David J. Kappos
*Director of the United States Patent and Trademark Office*